United States Patent
Takanashi et al.

(10) Patent No.: US 12,312,487 B2
(45) Date of Patent: May 27, 2025

(54) METHOD FOR FORMING PROTECTIVE FILM, METHOD FOR MANUFACTURING PATTERNED SUBSTRATE, AND COMPOSITION

(71) Applicant: JSR CORPORATION, Tokyo (JP)

(72) Inventors: Kazunori Takanashi, Tokyo (JP); Hiroyuki Miyauchi, Tokyo (JP); Nao Okumura, Tokyo (JP); Tomoharu Kawazu, Tokyo (JP); Satoshi Dei, Tokyo (JP)

(73) Assignee: JSR CORPORATION, Tokyo (JP)

( * ) Notice: Subject to any disclaimer, the term of this patent is extended or adjusted under 35 U.S.C. 154(b) by 52 days.

(21) Appl. No.: 18/127,066

(22) Filed: Mar. 28, 2023

(65) Prior Publication Data

US 2023/0242787 A1    Aug. 3, 2023

Related U.S. Application Data

(63) Continuation-in-part of application No. PCT/JP2021/035840, filed on Sep. 29, 2021.

(30) Foreign Application Priority Data

Oct. 8, 2020    (JP) ................ 2020-170483

(51) Int. Cl.
| | | |
|---|---|---|
| C09D 165/02 | (2006.01) | |
| C09D 5/16 | (2006.01) | |
| C09D 7/20 | (2018.01) | |
| H01L 21/311 | (2006.01) | |
| H01L 21/3213 | (2006.01) | |
| H01L 21/56 | (2006.01) | |
| B05D 5/12 | (2006.01) | |
| B05D 7/24 | (2006.01) | |

(52) U.S. Cl.
CPC ......... *C09D 165/02* (2013.01); *C09D 5/1662* (2013.01); *C09D 7/20* (2018.01); *H01L 21/31138* (2013.01); *H01L 21/31144* (2013.01); *H01L 21/32139* (2013.01); *H01L 21/56* (2013.01); *B05D 5/12* (2013.01); *B05D 7/24* (2013.01)

(58) Field of Classification Search
CPC ........... H01L 21/3114; H01L 21/32139; H01L 21/31138; H01L 21/56; C09D 7/20; C09D 165/02; B05D 2503/00; B05D 2504/00; B05D 2601/28; B05D 3/02; B05D 3/0254; B05D 5/12; B05D 7/00; B05D 7/24
USPC .......................... 252/500; 427/273; 430/329
See application file for complete search history.

(56) References Cited

U.S. PATENT DOCUMENTS

| | | | | |
|---|---|---|---|---|
| 2014/0038423 A1* | 2/2014 | Iwao | ................. | H01L 21/6708 438/758 |
| 2014/0154890 A1* | 6/2014 | Hatakeyama | ....... | H01L 21/6715 118/695 |
| 2018/0046081 A1* | 2/2018 | Miyake | ............... | H01L 21/0271 |
| 2020/0133123 A1* | 4/2020 | Kobayashi | ............ | G03F 7/0043 |
| 2020/0135451 A1* | 4/2020 | Zi | ....................... | H01L 21/0274 |

FOREIGN PATENT DOCUMENTS

| | | | |
|---|---|---|---|
| JP | 2004177668 A | 6/2004 | |
| JP | 4295937 B2 * | 7/2009 | ........... G03F 7/0382 |
| JP | 2016136572 A | 7/2016 | |

OTHER PUBLICATIONS

Translation of JP4295937. (Year: 2025).*
English translation of International Preliminary Report on Patentability and Written Opinion issued Apr. 20, 2023 in PCT/JP2021/035840, 6 pages.
International Search Report issued Dec. 21, 2021 in PCT/JP2021/035840, 2 pages.
Office Action issued Nov. 4, 2024, in corresponding Korean Patent Application No. 10-2023-7011601 (with machine English translation), 8 pages.

* cited by examiner

*Primary Examiner* — Tri V Nguyen
(74) *Attorney, Agent, or Firm* — Element IP, PLC

(57) ABSTRACT

A method for forming a protective film includes directly or indirectly coating only a periphery of a substrate with a composition. The composition includes a compound having an aromatic ring, and a solvent. The solvent includes a first solvent having a normal boiling point of 156° C. or higher and lower than 300° C. A content of the first solvent in the solvent is preferably 20 mass % or more and 100 mass % or less. The first solvent is preferably an ester, an alcohol, an ether, a carbonate, or a combination of two or more of an ester, an alcohol, an ether, and a carbonate.

24 Claims, No Drawings

METHOD FOR FORMING PROTECTIVE FILM, METHOD FOR MANUFACTURING PATTERNED SUBSTRATE, AND COMPOSITION

CROSS-REFERENCE TO RELATED APPLICATIONS

The present application is a continuation-in-part application of International Patent Application No. PCT/JP2021/035840 filed Sep. 29, 2021, which claims priority to Japanese Patent Application No. 2020-170483 filed Oct. 8, 2020. The contents of these applications are incorporated herein by reference in their entirety.

BACKGROUND OF THE DISCLOSURE

Technical Field

The present disclosure relates to a method for forming a protective film, a method for producing a patterned substrate, and a composition.

Background Art

A semiconductor device is produced using, for example, a multilayer resist process in which a resist pattern is formed by exposing and developing a resist film laminated on a substrate with a resist underlayer film, such as an organic underlayer film or a silicon-containing film, being interposed between them. In this process, the resist underlayer film is etched using this resist pattern as a mask, and the substrate is further etched using the obtained resist underlayer film pattern as a mask so that a desired pattern is formed on the substrate to obtain a patterned substrate (see, for example, JP-A-2004-177668).

Further, it has been proposed that a protective film is formed at the periphery of a substrate (see, for example, JP-A-2016-136572).

SUMMARY OF THE DISCLOSURE

According to an aspect of the present disclosure, a method for forming a protective film includes directly or indirectly coating only a periphery of a substrate with a composition. The composition includes a compound having an aromatic ring, and a solvent. The solvent includes a first solvent having a normal boiling point of 156° C. or higher and lower than 300° C.

According to another aspect of the present disclosure, a method for producing a patterned substrate includes directly or indirectly coating only a periphery of a substrate with a composition to form a protective film. A resist pattern is formed directly or indirectly on the substrate having the protective film. Etching is performed using the resist pattern as a mask. The composition includes a compound having an aromatic ring, and a solvent. The solvent includes a first solvent having a normal boiling point of 156° C. or higher and lower than 300° C.

According to a further aspect of the present disclosure, a composition includes a compound having an aromatic ring, and a solvent. The solvent includes a first solvent having a normal boiling point of 156° C. or higher and lower than 300° C. A content of the first solvent in the solvent is 20 mass % or more and 100 mass % or less. The composition is suitable to form a protective film only at a periphery of a substrate.

DESCRIPTION OF THE EMBODIMENTS

As used herein, the words "a" and "an" and the like carry the meaning of "one or more." When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

One embodiment of the present invention relates to a composition for forming a protective film only at a periphery of a substrate, the composition containing:
 a compound having an aromatic ring (hereinafter also referred to as an "[A] compound"); and
 a solvent (hereinafter also referred to as a "[B] solvent"), wherein
 the [B] solvent includes a first solvent (hereinafter also referred to as a "[B1] solvent") having a normal boiling point of 156° C. or higher and lower than 300° C.

Further, one embodiment of the present invention relates to a protective film formed of the composition for forming a protective film.

On the one hand, one embodiment of the present invention relates to a method for forming a protective film, including directly or indirectly coating only a periphery of a substrate with the composition for forming a protective film.

On the other hand, one embodiment of the present invention relates to a method for producing a patterned substrate, including:
 directly or indirectly coating only a periphery of a substrate with the composition for forming a protective film;
 directly or indirectly forming a resist pattern on the substrate having a protective film formed in the coating; and
 performing etching using the resist pattern as a mask.

Further, another embodiment of the production method may further include, before forming the resist pattern,
 directly or indirectly forming an organic underlayer film on the substrate having a protective film formed in the coating.

Further, another embodiment of the production method may further include, before forming the resist pattern, directly or indirectly forming a silicon-containing film on the substrate.

The composition for forming a protective film according to the embodiment of the present invention makes it possible to form a protective film excellent in coatability, especially, at the periphery of a substrate. The protective film according to the embodiment of the present invention is excellent in coatability at the periphery of a substrate. The method for forming a protective film according to the embodiment of the present invention makes it possible to obtain a protective film excellent in coatability at the periphery of a substrate. The method for producing a patterned substrate according to the embodiment of the present invention makes it possible to obtain a protective film excellent in coatability at the periphery of a substrate and therefore to obtain a substrate having an excellent pattern shape. Therefore, they can suitably be used for, for example, producing semiconductor devices expected to be further microfabricated in the future.

Hereinbelow, a composition for forming a protective film, a protective film, a method for forming a protective film, and a method for producing a patterned substrate according to an embodiment of the present invention will be described in detail.

<Protective Film Forming Composition>

The protective film forming composition as a composition for forming a protective film only at the periphery of a substrate contains an [A] compound and a [B] solvent. The protective film forming composition may contain a second solvent (hereinafter also referred to as a "[B2] solvent") having a normal boiling point of lower than 156° C. and may contain another optional component without impairing the effects of the present invention.

The protective film forming composition is used to form a protective film only at the periphery of a substrate.

The periphery of a substrate refers to, for example, an outer periphery of a substrate whose length from the outer peripheral edge toward the center of the substrate is 3.0 cm or less. The length from the outer peripheral edge toward the center of the substrate may be 2.0 cm, 1.0 cm, or 0.5 cm.

Examples of the substrate include metallic or semimetallic substrates such as a silicon substrate, an aluminum substrate, a nickel substrate, a chromium substrate, a molybdenum substrate, a tungsten substrate, a copper substrate, a tantalum substrate, and a titanium substrate. Among them, a silicon substrate is preferred. The substrate may be a substrate having a silicon nitride film, an alumina film, a silicon dioxide film, a tantalum nitride film, or a titanium nitride film formed thereon.

[[A] Compound]

The [A] compound is a compound having an aromatic ring. The [A] compound to be used is not particularly limited as long as it has an aromatic ring. The [A] compound to be used may be only one kind of [A] compound or a combination of two or more kinds of [A] compounds.

Examples of the aromatic ring include:
aromatic hydrocarbon rings such as a benzene ring, a naphthalene ring, an anthracene ring, an indene ring, a pyrene ring, a fluorenylidene biphenyl ring, and a fluorenylidene binaphthalene ring; and aromatic heterocycles such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring, and a triazine ring. Among them, aromatic hydrocarbon rings are preferred.

Examples of the [A] compound include: resins such as a resin having an aromatic ring in its main chain and a resin having an aromatic ring not in its main chain but in its side chain; and aromatic ring-containing compounds having a molecular weight of 300 or more and 3,000 or less.

Here, the "resin" refers to a compound having two or more structural units. The "aromatic ring-containing compound" refers to a compound having one structural unit. The "main chain" refers to the longest chain constituted from atoms in the resin. The "side chain" refers to a chain other than the longest chain constituted from atoms in the resin.

Examples of the resins include a polycondensation compound and a compound obtained by a reaction other than polycondensation.

Examples of such resins include a novolac resin, a resol resin, a styrene resin, an acenaphthylene resin, and a triazine resin.

(Novolac Resin)

The novolac resin is a resin obtained by reacting a phenolic compound and an aldehyde or a divinyl compound using an acidic catalyst. Two or more phenolic compounds and an aldehyde or a divinyl compound may be reacted by mixing them.

Examples of the phenolic compound include: phenols such as phenol, cresol, xylenol, resorcinol, bisphenol A, p-tert-butylphenol, p-octylphenol, 9,9-bis(4-hydroxyphenyl)fluorene, and 9,9-bis(3-hydroxyphenyl)fluorene; naphthols such as α-naphthol, β-naphthol, 1,5-dihydroxynaphthalene, 2,7-dihydroxynaphthalene, and 9,9-bis(6-hydroxynaphthyl)fluorene; anthrols such as 9-anthrol; and pyrenols such as 1-hydroxypyrene and 2-hydroxypyrene.

Examples of the aldehyde include: aldehydes such as formaldehyde, benzaldehyde, 1-naphthaldehyde, 2-naphthaldehyde, and 1-formylpyrene; and aldehyde sources such as paraformaldehyde and trioxane.

Examples of the divinyl compound include divinylbenzene, dicyclopentadiene, tetrahydroindene, 4-vinylcyclohexene, 5-vinylnorbornan-2-ene, divinylpyrene, limonene, and 5-vinylnorbornadiene.

Examples of the novolac resin include a resin having structural units derived from dihydroxynaphthalene and formaldehyde, a resin having structural units derived from fluorenebisphenol and formaldehyde, a resin having structural units derived from fluorenebisnaphthol and formaldehyde, a resin having structural units derived from hydroxypyrene and formaldehyde, a resin having structural units derived from a phenolic compound and formylpyrene, and a resin obtained by substituting some or all of hydrogen atoms in phenolic hydroxy groups of such a resin with propargyl groups or the like.

(Resol Resin)

The resol resin is a resin obtained by reacting a phenolic compound and an aldehyde using an alkaline catalyst.

(Styrene Resin)

The styrene resin is a resin having a structural unit derived from a compound having an aromatic ring and a polymerizable carbon-carbon double bond. The styrene resin may have, in addition to the above structural unit, a structural unit derived from an acrylic monomer, a vinyl ether, or the like.

Examples of the styrene resin include polystyrene, polyvinyl naphthalene, polyhydroxystyrene, polyphenyl (meth)acrylate, and a combination of two or more of these resins.

(Acenaphthylene Resin)

The acenaphthylene resin is a resin having a structural unit derived from a compound having an acenaphthylene skeleton.

From the viewpoint of further enhancing the coatability of a protective film, the acenaphthylene resin is preferably a copolymer of acenaphthylene and hydroxymethylacenaphthylene.

(Triazine Resin)

The triazine resin is a resin having a structural unit derived from a compound having a triazine skeleton.

Examples of the compound having a triazine skeleton include a melamine compound and a cyanuric acid compound.

When the [A] compound is a novolac resin, a resol resin, a styrene resin, an acenaphthylene resin, or a triazine resin, the polystyrene-equivalent weight-average molecular weight (Mw) of the [A] compound measured by gel permeation chromatography (GPC) is preferably more than 2,000, more preferably 3,000 or more, even more preferably 5,000 or more. The Mw is preferably 100,000 or less, more preferably 50,000 or less, even more preferably 30,000 or less.

(Calixarene Resin)

A calixarene resin is a cyclic oligomer in which aromatic rings, to which a hydroxy group is bonded, are bonded via hydrocarbon groups to be cyclic or such a cyclic oligomer in which some or all of hydrogen atoms in the hydroxy groups, aromatic rings, and hydrocarbon groups are substituted.

Examples of the calixarene resin include a cyclic 4- to 12-mer formed from a phenolic compound such as phenol or naphthol and formaldehyde, a cyclic 4- to 12-mer formed from a phenolic compound such as phenol or naphthol and a benzaldehyde compound, and a resin obtained by substituting hydrogen atoms in phenolic hydroxy groups of such a cyclic 4- to 12-mer with propargyl groups or the like.

(Aromatic Ring-Containing Compound Having Molecular Weight of 300 or More and 3,000 or Less)

The aromatic ring-containing compound is a compound having an aromatic ring and a molecular weight of 300 or more and 3,000 or less. The molecular weight of the aromatic ring-containing compound is determined from its structural formula. When the aromatic ring-containing compound has a molecular weight distribution, the molecular weight of the aromatic ring-containing compound is, for example, a polystyrene-equivalent weight-average molecular weight (Mw) measured by gel permeation chromatography (GPC).

Examples of the aromatic ring-containing compound include a compound having a fluorenebisphenol skeleton, a compound having a spiroindene skeleton, a compound having a truxene skeleton, and a compound having a triphenylbenzene skeleton.

The lower limit of content of the [A] compound in the composition is preferably 2 mass %, more preferably 4 mass %, even more preferably 5 mass %, particularly preferably 6 mass % with respect to the total mass of the [A] compound and the [B] solvent. The upper limit of the content is preferably 30 mass %, more preferably 25 mass %, even more preferably 20 mass %, particularly preferably 18 mass % with respect to the total mass of the [A] compound and the [B] solvent.

[Method for Synthesizing [A] Compound]

The [A] compound may be synthesized according to a known method or may be a commercially-available product.

[[B] Solvent]

The [B] solvent is a component to dissolve or disperse the [A] compound and the optional component contained if necessary. The [B] solvent includes a [B1] solvent. The [B] solvent may include a [B2] solvent. The [B] solvent may include another solvent other than the [B1] solvent and the [B2] solvent without impairing the effects of the present invention. Each of the components such as the [B1] solvent, the [B2] solvent, and the other solvent may be only one kind of solvent or a combination of two or more kinds of solvents. Each of the components will be described in detail below.

For example, the content of the [B] solvent in the composition for forming a protective film is preferably 10 mass % or more and 90 mass % or less, but may be 20 mass % or more and 80 mass % or less.

[[B1] Solvent]

The [B1] solvent is a solvent having a normal boiling point of 156° C. or higher and lower than 300° C. When the [B] solvent includes the [B1] solvent as a high-boiling component, evaporation of the solvent during heating of a coating film is prevented so that the fluidity of components constituting the coating film containing the solvent is improved. As a result, the coatability of a protective film can be improved.

The lower limit of normal boiling point of the [B1] solvent is preferably 170° C., more preferably 180° C., even more preferably 200° C., particularly preferably 210° C. When the normal boiling point of the [B1] solvent is equal to or higher than the above lower limit, the coatability of a protective film can more effectively be improved.

For example, the normal boiling point of the [B1] solvent is preferably 205° C. or higher.

The upper limit of normal boiling point of the [B1] solvent is preferably 250° C., more preferably 240° C., particularly preferably 230° C. When the normal boiling point of the [B1] solvent is equal to or lower than the above upper limit, a residue of the solvent after protective film formation can be reduced, which makes it possible to further improve solvent resistance.

Examples of component of the [B1] solvent include esters, alcohols, ethers, carbonates, ketones, and amide-based solvents. The temperature (° C.) in parentheses of each solvent mentioned below as an example is a normal boiling point.

Examples of the esters include
carboxylic acid esters such as acetic acid esters such as 2-ethylbutyl acetate (160° C.), 2-ethylhexyl acetate (199° C.), benzyl acetate (212° C.), cyclohexyl acetate (172° C.), methylcyclohexyl acetate (201° C.), and n-nonyl acetate (208° C.), acetoacetic acid esters such as methyl acetoacetate (169° C.) and ethyl acetoacetate (181° C.), propionic acid esters such as iso-amyl propionate (156° C.), oxalic acid esters such as diethyl oxalate (185° C.) and di-n-butyl oxalate (239° C.), lactic acid esters such as n-butyl lactate (185° C.), malonic acid esters such as diethyl malonate (199° C.), phthalic acid esters such as dimethyl phthalate (283° C.), lactones such as β-propiolactone (162° C.), γ-butyrolactone (204° C.), γ-valerolactone (207° C.), and γ-undecalactone (286° C.), and alkylene glycol diacetates such as 1,6-diacetoxyhexane (260° C.) and 1,3-butylene glycol diacetate (232° C.)

Examples of the alcohols include:
monoalcohols such as 3-methoxy butanol (157° C.), n-hexanol (157° C.), n-octanol (194° C.), sec-octanol (174° C.), n-nonyl alcohol (215° C.), n-decanol (228° C.), phenol (182° C.), cyclohexanol (161° C.), and benzyl alcohol (205° C.);

polyhydric alcohols such as ethylene glycol (197° C.), 1,2-propylene glycol (188° C.), 1,3-butylene glycol (208° C.), 2,4-pentanediol (201° C.), 2-methyl-2,4-pentanediol (196° C.), 2,5-hexanediol (216° C.), triethylene glycol (165° C.), dipropylene glycol (230° C.), and glycerin (290° C.);

polyhydric alcohol partial ethers such as ethylene glycol monobutyl ether (171° C.), ethylene glycol monophenyl ether (244° C.), diethylene glycol monomethyl ether (194° C.), diethylene glycol monoethyl ether (202° C.), triethylene glycol monomethyl ether (249° C.), diethylene glycol monoisopropyl ether (207° C.), diethylene glycol monobutyl ether (231° C.), triethylene glycol monobutyl ether (271° C.), ethylene glycol monoisobutyl ether (161° C.), diethylene glycol monoisobutyl ether (220° C.), ethylene glycol monohexyl ether (208° C.), diethylene glycol monohexyl ether (259° C.), ethylene glycol mono(2-ethylhexyl) ether (229° C.), diethylene glycol mono(2-ethylhexyl) ether (272° C.), ethylene glycol monoallyl ether (159°

C.), diethylene glycol monophenyl ether (283° C.), ethylene glycol monobenzyl ether (256° C.), diethylene glycol monobenzyl ether (302° C.), dipropylene glycol monomethyl ether (187° C.), tripropylene glycol monomethyl ether (242° C.), dipropylene glycol monopropyl ether (212° C.), propylene glycol monobutyl ether (170° C.), dipropylene glycol monobutyl ether (231° C.), and propylene glycol monophenyl ether (243° C.)

Examples of the ethers include:

dialkylene glycol monoalkyl ether acetates such as dipropylene glycol monomethyl ether acetate (213° C.), diethylene glycol monoethyl ether acetate (217° C.), and diethylene glycol monobutyl ether acetate (247° C.);

alkylene glycol monoalkyl ether acetates such as butylene glycol monomethyl ether acetate (172° C.) and ethylene glycol monobutyl ether acetate (188° C.);

dialkylene glycol dialkyl ethers such as diethylene glycol dimethyl ether (162° C.), diethylene glycol methyl ethyl ether (176° C.), diethylene glycol diethyl ether (189° C.), diethylene glycol dibutyl ether (255° C.), and dipropylene glycol dimethyl ether (171° C.);

trialkylene glycol dialkyl ethers such as triethylene glycol dimethyl ether (216° C.);

tetraalkylene glycol dialkyl ethers such as tetraethylene glycol dimethyl ether (275° C.);

dihydrocarbon group ethers such as diisopentyl ether (171° C.), anisole (155° C.), ethyl benzyl ether (189° C.), diphenyl ether (259° C.), dibenzyl ether (297° C.), and dihexyl ether (226° C.); and cyclic ethers such as 1,8-cineole (176° C.)

Examples of the carbonates include ethylene carbonate (244° C.) and propylene carbonate (242° C.)

Examples of the ketones include ethyl amyl ketone (167° C.), dibutyl ketone (186° C.), and diamyl ketone (228° C.)

Examples of the amide-based solvents include N-methyl pyrrolidone (204° C.), N,N-dimethyl acetamide (165° C.), formamide (210° C.), N-ethylacetamide (206° C.), and N-methylacetamide (206° C.)

Examples of the other solvent include furfural (162° C.), dimethylsulfoxide (189° C.), sulfolane (287° C.), succinonitrile (265° C.), and nitrobenzene (211° C.).

Among them, esters, alcohols, ethers, carbonates, or combinations of two or more of them are preferred, carboxylic acid esters, monoalcohols, polyhydric alcohols, polyhydric alcohol partial ethers, dialkylene glycol monoalkyl ether acetates, and dialkylene glycol dialkyl ethers are more preferred, γ-butyrolactone, benzyl alcohol, dipropylene glycol dimethyl ether, dipropylene glycol monomethyl ether, dipropylene glycol monobutyl ether, tripropylene glycol monomethyl ether, dipropylene glycol monomethyl ether acetate, diethylene glycol monoethyl ether acetate, diethylene glycol monobutyl ether acetate, and propylene carbonate are even more preferred, and dipropylene glycol monomethyl ether acetate and diethylene glycol monoethyl ether acetate are particularly preferred.

When the [B1] solvent is the solvent mentioned above, the coatability of a protective film can be improved.

When the evaporation rate of butyl acetate is defined as 100, the lower limit of relative evaporation rate of the [B1] solvent is preferably 0.01, more preferably 0.05, even more preferably 0.1. When the relative evaporation rate of the [B1] solvent is equal to or more than the above lower limit, a residue of the solvent after protective film formation can be reduced.

When the evaporation rate of butyl acetate is defined as 100, the upper limit of relative evaporation rate of the [B1] solvent is preferably 10, more preferably 8, even more preferably 6, particularly preferably 4. When the relative evaporation rate of the [B1] solvent is equal to or less than the above upper limit, evaporation of the solvent during heating of a coating film is prevented so that the fluidity of components constituting the coating film containing the [B1] solvent is further improved, which makes it possible to further improve coatability.

It should be noted that the "relative evaporation rate" refers to an evaporation rate measured in accordance with ASTM-D3539 under conditions of 25° C. and 1 atm.

Examples of the [B1] solvent having a relative evaporation rate within the above range (hereinafter the value in parentheses of each solvent represents a relative evaporation rate when the evaporation rate of butyl acetate is defined as 100) include propylene glycol monobutyl ether (7), dipropylene glycol monomethyl ether acetate (1.5), diethylene glycol monoethyl ether acetate (1), diethylene glycol monobutyl ether acetate (less than 1), dipropylene glycol monomethyl ether (3), dipropylene glycol monobutyl ether (1), tripropylene glycol monomethyl ether (less than 1), and γ-butyrolactone (less than 1).

The viscosity of the [B1] solvent is preferably 0.8 mPa·s or more and 10.0 mPa·s or less. When the viscosity of the [B1] solvent is within the above range, the fluidity of components constituting a coating film containing the [B1] solvent during heating of the coating film is further improved, which makes it possible to further improve coatability.

It should be noted that the "viscosity" represents the resistance of a liquid (fluid) of a substance to flow and is referred to also as coefficient of viscosity. As the viscosity, a value measured at 25° C. mentioned in "Handbook of Solvents" or the like can be referenced. In the case of a solvent whose viscosity is not mentioned in the Handbook of Solvents, the viscosity is measured at 25° C. by a method specified in JIS-Z8803:2011.

The lower limit of viscosity of the [B1] solvent is preferably 1.0 mPa·s, more preferably 1.5 mPa·s.

The upper limit of viscosity of the [B1] solvent is preferably 8.0 mPa·s, more preferably 6.0 mPa·s, even more preferably 5.0 mPa·s, particularly preferably 3.5 mPa·s. When the viscosity of the [B1] solvent is within the above range, fluidity of the [B1] solvent is further improved, which makes it possible to further improve coatability.

Examples of the [B1] solvent having a viscosity within the above range (hereinafter the value in parentheses of each solvent represents a viscosity at 25° C.) include dipropylene glycol monomethyl ether acetate (1.7 mPa·s), diethylene glycol monoethyl ether acetate (2.5 mPa·s), diethylene glycol monobutyl ether acetate (3.1 mPa·s), dipropylene glycol dimethyl ether (1.0 mPa·s), dipropylene glycol monomethyl ether (3.6 mPa·s), dipropylene glycol monobutyl ether (4.5 mPa·s), tripropylene glycol monomethyl ether (5.3 mPa·s), γ-butyrolactone (1.8 mPa·s), propylene carbonate (2.3 mPa·s), tetraethylene glycol dimethyl ether (3.8 mPa·s), 1,6-diacetoxyhexane (3.9 mPa·s), dipropylene glycol (20 mPa·s), and 1,3-butylene glycol diacetate (2.9 mPa·s).

The content of the [B1] solvent in the [B] solvent contained in the protective film forming composition may be, for example, 0.1 mass % or more and 100 mass % or less. The lower limit of the content is more preferably 10 mass %, even more preferably 30 mass %, particularly preferably 40 mass %, even particularly preferably 45 mass %. When the content of the [B1] solvent is equal to or more than the above lower limit, coatability can further be improved. The upper limit of the content is more preferably 80 mass %, even more preferably 70 mass %, particularly preferably 60 mass %, even particularly preferably 55 mass %. When the content of the [B1] solvent is equal to or less than the above upper limit, coatability can further be improved.

[[B2] Solvent]

The [B2] solvent is a solvent having a normal boiling point of lower than 156° C.

The upper limit of normal boiling point of the [B2] solvent is preferably 155° C., more preferably 147° C. When the normal boiling point of the [B2] solvent is equal to or lower than the above upper limit, solubility of the [A] compound can be improved. The lower limit of normal boiling point of the [B2] solvent is preferably 100° C., more preferably 120° C. When the normal boiling point of the [B2] solvent is equal to or higher than the above lower limit, solubility of the [A] compound and the other optional component can be improved, which makes it possible to improve the storage stability of the protective film forming composition.

Examples of the [B2] solvent (the temperature (° C.) in parentheses is a normal boiling point) include:

monoalcohols such as methanol (65° C.), ethanol (78° C.), n-propanol (97° C.), iso-propanol (82° C.), n-butanol (117° C.), iso-butanol (108° C.), sec-butanol (99° C.), tert-butanol (82° C.), n-pentanol (138° C.), iso-pentanol (132° C.), 2-methyl butanol (136° C.), sec-pentanol (118° C.), tert-pentanol (102° C.), 2-methyl pentanol (148° C.), and 2-ethyl butanol (146° C.);

carboxylic acid esters such as propionic acid esters such as iso-butyl propionate (138° C.) and lactic acid esters such as ethyl lactate (151° C.);

alkylene glycol monoalkyl ethers such as ethylene glycol monomethyl ether (125° C.), ethylene glycol monoethyl ether (135° C.), propylene glycol monomethyl ether (121° C.), propylene glycol monoethyl ether (133° C.), and propylene glycol monopropyl ether (149.8° C.); and alkylene glycol monoalkyl ether acetates such as ethylene glycol monomethyl ether acetate (145° C.) and propylene glycol monomethyl ether acetate (146° C.).

From the viewpoint of further improving the solubility of the [A] compound, among these [B2] solvents, alkylene glycol monoalkyl ethers, alkylene glycol monoalkyl ether acetates, or combinations of two or more of them are preferred, propylene glycol monoalkyl ether acetates are more preferred, and propylene glycol monomethyl ether acetate is even more preferred.

The lower limit of content of the [B2] solvent in the [B] solvent contained in the protective film forming composition is preferably 10 mass %, more preferably 30 mass %, particularly preferably 40 mass %, even particularly preferably 45 mass %. The upper limit of the content is preferably 80 mass %, more preferably 70 mass %, particularly preferably 60 mass %, even particularly preferably 55 mass %. When the content of the [B2] solvent is within the above range, coatability can further be improved.

[[D] Another Optional Component]

As another component other than the [A] compound and the [B] solvent, the protective film forming composition may contain, for example, an acid generator, a macromolecular additive, a surfactant, a crosslinking agent, or the like.

The acid generator is a compound that generates an acid by radiation irradiation and/or heating. The protective film forming composition may contain one kind or two or more kinds of acid generators.

Examples of the acid generator include an onium salt compound and an N-sulfonyloxyimide compound.

Examples of the macromolecular additive include a (poly) oxyalkylene-based macromolecular compound, a fluorine-based macromolecular compound, and a non-fluorine-based macromolecular compound.

Examples of the (poly)oxyalkylene-based macromolecular compound include: polyoxyalkylenes such as a (poly) oxyethylene-(poly)oxypropylene adduct; (poly)oxyalkyl ethers such as diethylene glycol heptyl ether, polyoxyethylene oleyl ether, polyoxypropylene butyl ether, polyoxyethylene polyoxypropylene-2-ethyl hexyl ether, and an adduct of oxyethylene-oxypropylene to a higher alcohol having 12 to 14 carbon atoms; (poly)oxyalkylene (alkyl) aryl ethers such as polyoxypropylene phenyl ether and polyoxyethylene nonyl phenyl ether; acetylene ethers obtained by addition polymerization of acetylene alcohol and an alkylene oxide, such as 2,4,7,9-tetramethyl-5-decyne-4,7-diol, 2,5-dimethyl-3-hexyne-2,5-diol, and 3-methyl-1-butyn-3-ol; (poly) oxyalkylene fatty acid esters such as diethylene glycol oleic acid ester, diethylene glycol lauric acid ester, and ethylene glycol distearic acid ester; (poly)oxyalkylene sorbitan fatty acid esters such as polyoxyethylene sorbitan monolauric acid ester and polyoxyethylene sorbitan trioleic acid ester; (poly)oxyalkylene alkyl (aryl) ether sulfuric acid ester salts such as polyoxypropylene methyl ether sodium sulfate and polyoxyethylene dodecyl phenol ether sodium sulfate; (poly)oxyalkylene alkyl phosphoric acid esters such as (poly)oxyethylene stearyl phosphoric acid ester; and (poly) oxyalkylene alkyl amines such as polyoxyethylene lauryl amine.

Examples of the fluorine-based macromolecular compound include compounds containing a repeating unit derived from a (meth)arylate compound having a fluorine atom and a repeating unit derived from a (meth)acrylate compound having two or more (preferably 5 or more) alkyleneoxy groups (preferably an ethyleneoxy group, a propyleneoxy group).

Examples of the non-fluorine-based macromolecular compound include compounds containing one kind or two or more kinds of repeating units derived from a (meth)acrylate monomer such as a linear or branched alkyl (meth)acrylate such as lauryl (meth)acrylate, 2-ethylhexyl (meth)acrylate, n-butyl (meth)acrylate, t-butyl (meth)acrylate, isooctyl (meth)acrylate, isostearyl (meth)acrylate, or isononyl (meth) acrylate, an alkoxyethyl (meth)acrylate such as methoxyethyl (meth)acrylate, an alkylene glycol di(meth)acrylate such as ethylene glycol di(meth)acrylate or 1,3-butylene glycol di(meth)acrylate, a hydroxyalkyl (meth)acrylate such as 2-hydroxyethyl (meth)acrylate, 2-hydroxypropyl (meth) acrylate, 2-hydroxybutyl (meth)acrylate, or 4-hydroxybutyl (meth)acrylate, dicyclopentenyloxyethyl (meth)acrylate, or nonylphenoxy polyethylene glycol (having a —$(CH_2CH_2O)_n$— structure, n=1 to 17) (meth)acrylate.

Examples of a commercially-available product of the surfactant include "Newcol 2320", "Newcol 714-F", "Newcol 723", "Newcol 2307", and "Newcol 2303" (which are all manufactured by NIPPON NYUKAZAI CO., LTD.), "Pionin D-1107-S", "Pionin D-1007", "Pionin D-1106-DIR", "Newkalgen TG310", "Pionin D-6105-W", "Pionin D-6112", and "Pionin D-6512" (which are all manufactured by TAKEMOTO OIL & FAT Co., Ltd.), "SURFYNOL 420" "SURFYNOL 440", "SURFYNOL 465", and "SURFYNOL 2502" (which are all manufactured by Air Products and Chemicals, Inc.), "MEGAFACE F171", "MEGAFACE F172", "MEGAFACE F173", "MEGAFACE F176", "MEGAFACE F177", "MEGAFACE F141", "MEGAFACE F142", "MEGAFACE F143", "MEGAFACE F144", "MEGAFACE R30", "MEGAFACE F437", "MEGAFACE F475", "MEGAFACE F479", "MEGAFACE F482", "MEGAFACE F562", "MEGAFACE F563", "MEGAFACE F780", "MEGAFACE R-40", "MEGAFACE DS-21", "MEGAFACE RS-56", "MEGAFACE RS-90", and "MEGAFACE RS-72-K" (which are all manufactured by DIC Corporation), "Fluorad FC430" and "Fluorad FC431" (which are all manufactured by Sumitomo 3M Limited), "AsahiGuard AG710", "Surflon S-382", "Surflon SC-101", "Surflon SC-102", "Surflon SC-103", "Surflon SC-104", "Surflon SC-105", and "Surflon SC-106 (which are all manufactured by AGC Inc.), and "FTX-218" and "NBX-15" (manufactured by NEOS COMPANY LIMITED).

The crosslinking agent is a component that forms a crosslinking bond between components such as the [A] compound by the action of heat or an acid. Even when the [A] compound has an intermolecular bond-forming group, the hardness of a protective film can be increased by further adding the crosslinking agent to the protective film forming composition. The crosslinking agent to be used may be only one kind of crosslinking agent or a combination of two or more kinds of crosslinking agents.

Examples of the crosslinking agent include: polyfunctional (meth)acrylate compounds such as trimethylol propane tri(meth)acrylate and pentaerythritol tri(meth)acrylate; epoxy compounds such as novolac-type epoxy resins and bisphenol-type epoxy resins; hydroxymethyl group-substituted phenol compounds such as 2-hydroxymethyl-4,6-dimethyl phenol and 4,4'-(1-(4-(1-(4-hydroxy-3,5-bis(methoxymethyl)phenyl)-1-methylethyl)phenyl)ethylidene)bis(2,6-bis(methoxymethyl)phenol); alkoxyalkyl group-containing phenol compounds such as methoxymethyl group-containing phenol compounds and ethoxymethyl group-containing phenol compounds; and compounds having an alkoxyalkylated amino group, such as (poly)methylolated melamine and (poly)methylolated glycoluril.

When the protective film forming composition contains the other optional component, the lower limit of content of the other optional component is preferably 0.1 parts by mass, more preferably 0.5 parts by mass, even more preferably 1 part by mass per 100 parts by mass of the [A] compound. The upper limit of the content is preferably 20 parts by mass, more preferably 10 parts by mass, even more preferably 5 parts by mass per 100 parts by mass of the [A] compound.

[Method for Preparing Composition for Forming Protective Film]

The protective film forming composition can be prepared by mixing the [A] compound, the [B] solvent, and the [D] another optional component contained if necessary in a predetermined ratio and preferably filtering the obtained mixture through a membrane filter or the like having a pore diameter of 0.1 μm or less.

<Protective Film>

The protective film according to this embodiment is formed of the protective film forming composition. The protective film is excellent in coatability.

<Method for Forming Protective Film>

The method for forming a protective film according to this embodiment includes directly or indirectly coating only a periphery of a substrate with the composition for forming a protective film (hereinafter also referred to as a "coating step").

The method for forming a protective film uses the composition for forming a protective film in the coating step, and therefore a protective film excellent in coatability can be formed.

The method for forming a protective film preferably further includes heating a coating film formed in the coating step (hereinafter also referred to as a "heating step").

Each of the steps will be described below.

[Coating Step]

In this step, only the periphery of a substrate is directly or indirectly coated with the composition for forming a protective film. The coating can be performed by spin coating. A coating film is formed by rotating a substrate and discharging the composition for forming a protective film onto the periphery of the substrate, and a protective film is formed by, for example, a crosslinking reaction of the [A] compound contained in the coating film and volatilization of the solvent.

[Heating Step]

In this step, the coating film formed in the coating step is heated. This promotes protective film formation.

The heating of the coating film is usually performed in the atmosphere but may be performed in a nitrogen atmosphere. The lower limit of a heating temperature is preferably 150° C., and more preferably 200° C. The upper limit of the temperature is preferably 600° C., more preferably 400° C. The lower limit of a heating time is preferably 15 seconds, more preferably 30 seconds. The upper limit of the time is preferably 1200 seconds, more preferably 600 seconds.

The lower limit of average thickness of a protective film to be formed is preferably 30 nm, more preferably 50 nm, even more preferably 100 nm. The upper limit of the average thickness is preferably 3,000 nm, more preferably 2,000 nm, even more preferably 500 nm. It should be noted that the average thickness of a protective film is determined in the following manner: the protective film forming composition is discharged onto the center of a substrate, a film is formed of the protective film forming composition on the entire surface of the substrate by spin coating, the thickness of the film is measured at freely-selected 9 positions, including the center of the substrate, located at intervals of 5 cm with the use of a spectroscopic ellipsometer ("M2000D" manufactured by J. A. WOOLLAM), and the average of these film thicknesses is calculated.

<Method for Producing Patterned Substrate>

The method for producing a patterned substrate includes:
directly or indirectly coating only a periphery of a substrate with the composition for forming a protective film (hereinafter also referred to as a "coating step");
directly or indirectly forming a resist pattern on the substrate having a protective film formed in the coating step (hereinafter also referred to as a "resist pattern forming step"); and
performing etching using the resist pattern as a mask (hereinafter also referred to as an "etching step").

According to the method for producing a patterned substrate, the protective film excellent in coatability is formed in the coating step, which makes it possible to produce a patterned substrate having an excellent pattern shape.

If necessary, the method for producing a patterned substrate may further include, before the resist pattern forming step, directly or indirectly forming an organic underlayer film on the substrate having a protective film formed in the coating step (hereinafter also referred to as an "organic underlayer film forming step).

If necessary, the method for producing a patterned substrate may further include, before the resist pattern forming step, directly or indirectly forming a silicon-containing film on the substrate having a protective film formed in the coating step (hereinafter also referred to as a "silicon-containing film forming step").

Each of the steps will be described below.

[Coating Step]

In this step, only the periphery of a substrate is directly or indirectly coated with the composition for forming a protective film. This step is the same as the coating step in the above-described method for forming a protective film.

[Organic Underlayer Film Forming Step]

In this step, an organic underlayer film is directly or indirectly formed on the substrate having a protective film.

The organic underlayer film can be formed by, for example, coating with a composition for forming an organic underlayer film. An example of a method for forming an organic underlayer film by coating with a composition for forming an organic underlayer film is a method in which the substrate having a protective film is directly or indirectly coated with a composition for forming an organic underlayer film, and a formed coating film is cured by heating or lithographic exposure. The composition for forming an organic underlayer film may be, for example, "HM8006" manufactured by JSR Corporation. Various conditions for heating or lithographic exposure can appropriately be determined depending on, for example, the type of composition for forming an organic underlayer film to be used.

[Silicon-Containing Film Forming Step]

In this step, a silicon-containing film is directly or indirectly formed on the substrate having a protective film.

An example of a case where a silicon-containing film is indirectly formed on the substrate having a protective film is a case where a surface modification film for the protective film is formed on the protective film.

The silicon-containing film can be formed by, for example, coating with a composition for forming a silicon-containing film, chemical vapor deposition (CVD), or atomic layer deposition (ALD). An example of a method for forming a silicon-containing film by coating with a composition for forming a silicon-containing film is a method in which a coating film formed by directly or indirectly coating the protective film with a composition for forming a silicon-containing film is cured by lithographic exposure and/or heating. As a commercially-available product of the composition for forming a silicon-containing film, for example, "NFC SOG01", "NFC SOG04", "NFC SOG080" (which are all manufactured by JSR Corporation), or the like can be used. Chemical vapor deposition (CVD) or atomic layer deposition (ALD) can form a silicon oxide film, a silicon nitride film, a silicon oxynitride film, or an amorphous silicon film.

[Resist Pattern Forming Step]

In this step, a resist pattern is directly or indirectly formed on the protective film. Examples of a method for performing this step include a method using a resist composition, a method using nanoimprinting, and a method using a self-assembly composition. An example of a case where a resist pattern is indirectly formed on the protective film is a case where, when the method for producing a patterned substrate includes the silicon-containing film forming step, a resist pattern is formed on the silicon-containing film.

Specifically, the method using a resist composition is performed by applying a resist composition in such a manner that a resist film to be formed has a predetermined thickness and then volatilizing a solvent in a coating film by pre-baking to form a resist film.

Examples of the resist composition include a positive or negative chemically amplified resist composition containing a radiation sensitive acid generator, a positive resist composition containing an alkali-soluble resin and a quinonediazide-based photosensitizer, and a negative resist composition containing an alkali-soluble resin and a crosslinking agent. It should be noted that in this step, a commercially-available resist composition may directly be used.

Then, the formed resist film is subjected to lithographic exposure by selective radiation irradiation. Radiation used for lithographic exposure can appropriately be selected depending on the type of radiation sensitive acid generator used in the resist composition, and examples thereof include electromagnetic rays such as visible rays, ultraviolet rays, far-ultraviolet, X rays, and γ rays and corpuscular rays such as electron rays, molecular rays, and ion beams. Among them, far-ultraviolet is preferred, KrF excimer laser light (248 nm), ArF excimer laser light (193 nm), F2 excimer laser light (wavelength: 157 nm), $Kr_2$ excimer laser light (wavelength: 147 nm), ArKr excimer laser light (wavelength: 134 nm), or extreme ultraviolet (wavelength: 13.5 nm, hereinafter also referred to as "EUV") is more preferred, and KrF excimer laser light, ArF excimer laser light, or EUV is even more preferred.

After the lithographic exposure, post-baking may be performed to improve resolution, pattern profile, developability, etc. The temperature and time of the post-baking may appropriately be determined depending on, for example, the type of resist composition to be used.

Then, the resist film subjected to lithographic exposure is developed with a developer to form a resist pattern. This development may either be alkaline development or organic solvent development. Examples of the developer for alkaline development include basic aqueous solutions such as ammonia, triethanolamine, tetramethylammonium hydroxide (TMAH), and tetraethylammonium hydroxide. To these basic aqueous solutions, for example, a water-soluble organic solvent such as an alcohol (e.g., methanol, ethanol) or a surfactant may be added in an appropriate amount. Examples of the developer for organic solvent development include various organic solvents mentioned above as examples of the [B] solvent contained in the composition.

After the development with a developer, a predetermined resist pattern is formed by washing and drying.

[Etching Step]

In this step, etching is performed using the resist pattern as a mask. The number of times of etching may be once or twice or more, that is, etching may sequentially be performed using a pattern obtained by etching as a mask. However, from the viewpoint of obtaining a pattern having a more excellent shape, etching is preferably performed twice or more. When performed twice or more, etching is sequentially performed in the order of the silicon-containing film, the protective film, and the substrate. Examples of an etching method include dry etching and wet etching. Among them, dry etching is preferred from the viewpoint of achieving a more excellent pattern shape of the substrate. The dry etching uses, for example, gas plasma such as oxygen plasma. As a result of the etching, a patterned substrate having a predetermined pattern is obtained.

The dry etching can be performed using, for example, a known dry etching device. An etching gas used for the dry etching can appropriately be selected depending on, for example, a mask pattern or the elemental composition of a film to be etched, and examples thereof include a fluorine-based gas such as $CHF_3$, $CF_4$, $C_2F_6$, $C_3F_8$, or $SF_6$, a chlorine-based gas such as $Cl_2$ or $BCl_3$, an oxygen-based gas such as $O_2$, $O_3$, or $H_2O$, a reductive gas such as $H_2$, $NH_3$, CO, $CO_2$, $CH_4$, $C_2H_2$, $C_2H_4$, $C_2H_6$, $C_3H_4$, $C_3H_6$, $C_3H_8$, HF, HI, HBr, HCl, NO, $NH_3$, or $BCl_3$, and an inert gas such as He, $N_2$, or Ar. These gases may be used by mixing two or more of them. When the substrate is etched using the pattern of the protective film as a mask, a fluorine-based gas is usually used.

EXAMPLES

Hereinbelow, Examples will be described. The following Examples merely illustrate typical Examples of the present invention and should not be construed to narrow the scope of the present invention.

[Weight-Average Molecular Weight (Mw)]

The Mw of a polymer was measured by gel permeation chromatography (detector: differential refractometer) with monodisperse polystyrene standards using GPC columns ("G2000HXL"×2, "G3000HXL"×1, and "G4000HXL"×1) manufactured by Tosoh Corporation under the following analysis conditions: flow rate, 1.0 mL/min; elution solvent, tetrahydrofuran; column temperature, 40° C.

[Average Thickness of Protective Film]

The average thickness of a protective film was determined in the following manner: a protective film forming composition was discharged onto the center of a substrate, a film was formed of the protective film forming composition on the entire surface of the substrate by spin coating, the thickness of the film was measured at freely-selected 9 positions, including the center of the substrate, located at intervals of 5 cm with the use of a spectroscopic ellipsometer ("M2000D" manufactured by J. A. WOOLLAM), and the average of these film thicknesses was calculated.

<Preparation of Protective Film Forming Composition>

An [A] compound, a [B] solvent, and [D] another optional component used to prepare a protective film forming composition will be described below. In the following Table 1, "-" represents that the corresponding [B] solvent or [D] another optional component was not used.

[[A] Compound]

A-1: A resin having a structural unit represented by the following formula (A-1).

A-2: A resin having a structural unit represented by the following formula (A-2).

A-3: A resin having a structural unit represented by the following formula (A-3).

A-4: A resin having a structural unit represented by the following formula (A-4).

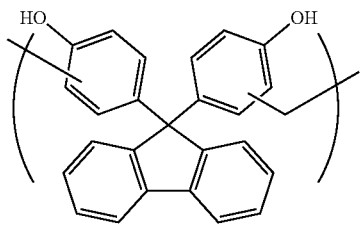

(A-1)

(A-2)

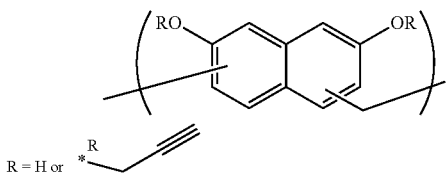

(A-3)

(A-4)

R = H or *——≡—R

<Synthesis of [A] Compound>

As [A] compounds, polymers represented by the above formulas (A-1) to (A-4) (hereinafter also referred to as "polymers (A-1) to (A-4)") were synthesized in the following procedure.

A number beside a structural unit in the above formula (A-1) represents the content (mol %) of the structural unit. In the above formula (A-4), *R represents a moiety bonded to an oxygen atom.

[Synthesis Example 1-1] (Synthesis of Polymer (A-1))

In a nitrogen atmosphere, 70 g of m-cresol, 57.27 g of p-cresol, 95.52 g of a 37 mass % aqueous formaldehyde solution, and 381.82 g of methyl isobutyl ketone were added to a reaction container and dissolved. The obtained solution was heated to 40° C., 2.03 g of p-toluenesulfonic acid was then added thereto, and the resultant was reacted at 85° C. for 4 hours. The reaction liquid was cooled to 30° C. or lower and charged into a mixed solution of methanol/water (50/50 (mass ratio)) for reprecipitation. A precipitate was collected on filter paper and dried to obtain a polymer (A-1). The Mw of the polymer (A-1) was 50,000.

[Synthesis Example 1-2] (Synthesis of Polymer (A-2))

In a nitrogen atmosphere, 150 g of 2,7-dihydroxynaphthalene, 76.01 g of a 37 mass % aqueous formaldehyde solution, and 450 g of methyl isobutyl ketone were added to a reaction container and dissolved. The obtained solution was heated to 40° C., 1.61 g of p-toluenesulfonic acid was then added thereto, and the resultant was reacted at 80° C. for 7 hours. The reaction liquid was cooled to 30° C. or lower and charged into a mixed solution of methanol/water (50/50 (mass ratio)) for reprecipitation. A precipitate was collected on filter paper and dried to obtain a polymer (A-2). The Mw of the polymer (A-2) was 3,000.

[Synthesis Example 1-3] (Synthesis of Polymer (A-3))

In a nitrogen atmosphere, 37.9 g of 9,9-bis(4-hydroxyphenyl)fluorene and 2.86 g of paraformaldehyde were charged into a reaction container. Then, 60 g of propylene glycol monomethyl ether acetate was added thereto for dissolution, 0.220 g of p-toluenesulfonic acid monohydrate was then added, and the resultant was stirred at 95° C. for 6 hours for polymerization. After the completion of the polymerization, a polymerization reaction liquid was charged into a large amount of a mixed solution of methanol/water (70/30 (mass ratio)), and the obtained precipitate was collected by filtration to obtain a polymer (A-3). The Mw of the polymer (A-3) was 4,500.

[Synthesis Example 1-4] (Synthesis of Polymer (A-4))

In a nitrogen atmosphere, 20 g of the polymer (A-2) synthesized in Synthesis Example 1-2, 80 g of N,N-dimethylacetamide, and 22 g of potassium carbonate were charged into a reaction container. Then, the resultant was heated to 80° C., and 19 g of propargyl bromide was added thereto to perform a reaction with stirring for 6 hours. Then, 40 g of methyl isobutyl ketone and 80 g of water were added to the reaction solution to perform separation of liquids, the obtained organic phase was then charged into a large amount of methanol, and the obtained precipitate was collected by filtration to obtain a polymer (A-4). The Mw of the polymer (A-4) was 3,200.

[[B] Solvent]
 B1-1: 1,6-diacetoxyhexane (normal boiling point: 260° C.)
 B1-2: Propylene carbonate (normal boiling point: 242° C.)
 B1-3: Dipropylene glycol methyl ether acetate (normal boiling point: 213° C.)
 B1-4: Gamma-butyrolactone (normal boiling point: 204° C.)
 B1-5: Tripropylene glycol monomethyl ether (normal boiling point: 242° C.)
 B1-6: Ethyl 3-ethoxypropionate (normal boiling point: 170° C.)
[B2] Solvent]
 B2-1: Propylene glycol monomethyl ether acetate (normal boiling point: 146° C.)
 B2-2: Ethyl lactate (normal boiling point: 154° C.)
 B2-3: Methyl 3-methoxypropionate (normal boiling point: 142° C.)
[[D] Another Optional Component]
 D-1: Surfactant ("NBX-15" manufactured by NEOS COMPANY LIMITED)
 D-2: Surfactant ("F563" manufactured by DIC Corporation)
 D-3: Poly(2-ethylhexyl acrylate)

[Example 1]<Preparation of Protective Film Forming Composition (J-1)>

First, 10 parts by mass of (A-1) as the [A] compound was dissolved in 100 parts by mass of (B1-1) as the [B] solvent. This solution was filtered through a polytetrafluoroethylene (PTFE) filter having a pore diameter of 0.2 μm to prepare a protective film forming composition (J-1).

[Examples 2 to 23 and Comparative Examples 1 to 4] (Preparation of Protective Film Forming Composition (J-2) to (J-23) and (CJ-1) to (CJ-4))

Each protective film forming composition was prepared in the same manner as in Example 1 except that the type and content of each of the components was changed as shown in the following Table 1.

TABLE 1

| | | [A] Compound | | [B] Solvent | | | | | | | [B2] Solvent | | [D] Another optional component | | |
| --- | --- | --- | --- | --- | --- | --- | --- | --- | --- | --- | --- | --- | --- | --- | --- |
| | | | Content (parts | [B1] Solvent type and content (parts by mass) | | | | | | | Content (parts | Type And Content (parts by mass) | | |
| | Composition | Type | by mass) | B1-1 | B1-2 | B1-3 | B1-4 | B1-5 | B1-6 | Type | by mass) | D-1 | D-2 | D-3 |
| Example 1 | J-1 | A-1 | 10 | 100 | — | — | — | — | — | — | — | — | — | — |
| Example 2 | J-2 | A-1 | 10 | — | 100 | — | — | — | — | — | — | — | — | — |
| Example 3 | J-3 | A-1 | 10 | — | — | 100 | — | — | — | — | — | — | — | — |
| Example 4 | J-4 | A-1 | 10 | — | — | — | 100 | — | — | — | — | — | — | — |
| Example 5 | J-5 | A-1 | 10 | — | — | — | — | 100 | — | — | — | — | — | — |
| Example 6 | J-6 | A-1 | 10 | — | — | — | — | — | 100 | — | — | — | — | — |
| Example 7 | J-7 | A-1 | 10 | — | 90 | — | — | — | — | B2-1 | 10 | — | — | — |
| Example 8 | J-8 | A-1 | 10 | — | 70 | — | — | — | — | B2-1 | 30 | — | — | — |
| Example 9 | J-9 | A-1 | 10 | — | 50 | — | — | — | — | B2-1 | 50 | — | — | — |
| Example 10 | J-10 | A-1 | 10 | — | 30 | — | — | — | — | B2-1 | 70 | — | — | — |
| Example 11 | J-11 | A-1 | 10 | — | 10 | — | — | — | — | B2-1 | 90 | — | — | — |
| Example 12 | J-12 | A-1 | 10 | — | 50 | — | — | — | — | B2-1 | 50 | 0.1 | — | — |
| Example 13 | J-13 | A-1 | 10 | — | 50 | — | — | — | — | B2-1 | 50 | — | 1 | — |
| Example 14 | J-14 | A-1 | 10 | — | 50 | — | — | — | — | B2-1 | 50 | — | — | 1 |
| Example 15 | J-15 | A-1 | 10 | 50 | — | — | — | — | — | B2-1 | 50 | — | — | — |
| Example 16 | J-16 | A-1 | 10 | — | — | 50 | — | — | — | B2-1 | 50 | — | — | — |
| Example 17 | J-17 | A-1 | 10 | — | — | — | 50 | — | — | B2-1 | 50 | — | — | — |
| Example 18 | J-18 | A-1 | 10 | — | 10 | 40 | — | — | — | B2-1 | 50 | — | — | — |
| Example 19 | J-19 | A-1 | 10 | — | — | 50 | — | — | — | B2-2 | 50 | — | — | — |
| Example 20 | J-20 | A-1 | 10 | — | — | 50 | — | — | — | B2-3 | 50 | — | — | — |
| Example 21 | J-21 | A-2 | 10 | — | 50 | — | — | — | — | B2-1 | 50 | — | — | — |
| Example 22 | J-22 | A-3 | 10 | — | 50 | — | — | — | — | B2-1 | 50 | — | — | — |

TABLE 1-continued

| | | [A] Compound | | [B] Solvent | | | | | | | | [D] Another optional component | | |
|---|---|---|---|---|---|---|---|---|---|---|---|---|---|---|
| | | | | [B1] Solvent type and content (parts by mass) | | | | | | [B2] Solvent | | Type And Content (parts by mass) | | |
| | Composition | Type | Content (parts by mass) | B1-1 | B1-2 | B1-3 | B1-4 | B1-5 | B1-6 | Type | Content (parts by mass) | D-1 | D-2 | D-3 |
| Example 23 | J-23 | A-4 | 10 | — | 50 | — | — | — | — | B2-1 | 50 | — | — | — |
| Comparative Example 1 | CJ-1 | A-1 | 10 | — | — | — | — | — | — | B2-1 | 100 | — | — | — |
| Comparative Example 2 | CJ-2 | A-2 | 10 | — | — | — | — | — | — | B2-1 | 100 | — | — | — |
| Comparative Example 3 | CJ-3 | A-3 | 10 | — | — | — | — | — | — | B2-1 | 100 | — | — | — |
| Comparative Example 4 | CJ-4 | A-4 | 10 | — | — | — | — | — | — | B2-1 | 100 | — | — | — |

<Evaluation>

The protective film forming compositions (J-1) to (J-23) and (CJ-1) to (CJ-4) obtained above were used to evaluate coatability in the following manner. The evaluation results are shown in the following Table 2.

[Coatability]

A silicon substrate was rotated at 1,500 rpm using a spin coater ("CLEAN TRACK ACT8" manufactured by Tokyo Electron Ltd.), each of the protective film forming composition (J-1) to (J-23) and (CJ-1) to (CJ-4) prepared above was discharged onto a position 1 cm away from the outer peripheral edge toward the center of the substrate for 5 seconds in an amount of 2 mL per second, and then the substrate was rotated at 1,500 rpm for 30 seconds, then heated in the atmosphere at 250° C. for 60 seconds, and then cooled at 23° C. for 60 seconds to obtain a substrate having a protective film formed thereon. The formed protective film was observed with an optical microscope and coatability was evaluated according to the following criteria: "A" (excellent) uneven coating was not observed; and "B" (poor) uneven coating was observed.

TABLE 2

| | Composition | Coatability |
|---|---|---|
| Example 1 | J-1 | A |
| Example 2 | J-2 | A |
| Example 3 | J-3 | A |
| Example 4 | J-4 | A |
| Example 5 | J-5 | A |
| Example 6 | J-6 | A |
| Example 7 | J-7 | A |
| Example 8 | J-8 | A |
| Example 9 | J-9 | A |
| Example 10 | J-10 | A |
| Example 11 | J-11 | A |
| Example 12 | J-12 | A |
| Example 13 | J-13 | A |
| Example 14 | J-14 | A |
| Example 15 | J-15 | A |
| Example 16 | J-16 | A |
| Example 17 | J-17 | A |
| Example 18 | J-18 | A |
| Example 19 | J-19 | A |
| Example 20 | J-20 | A |
| Example 21 | J-21 | A |
| Example 22 | J-22 | A |
| Example 23 | J-23 | A |
| Comparative Example 1 | CJ-1 | B |
| Comparative Example 2 | CJ-2 | B |
| Comparative Example 3 | CJ-3 | B |
| Comparative Example 4 | CJ-4 | B |

As can be seen from the results shown in Table 2, protective films formed of the protective film forming compositions of Examples achieved excellent results in all the evaluation items of coatability. On the other hand, protective films formed of the protective film forming compositions of Comparative Examples were poor in coatability.

The protective film forming composition according to the embodiment of the present invention makes it possible to form a protective film excellent in coatability at the periphery of a substrate. The protective film according to the embodiment of the present invention is excellent in coatability at the periphery of a substrate. The method for forming a protective film according to the embodiment of the present invention makes it possible to obtain a protective film excellent in coatability at the periphery of a substrate. The method for producing a patterned substrate according to the embodiment of the present invention makes it possible to obtain a protective film excellent in coatability at the periphery of a substrate and therefore to obtain a substrate having an excellent pattern shape. Therefore, they can suitably be used for, for example, producing semiconductor devices expected to be further microfabricated in the future.

Obviously, numerous modifications and variations of the present invention(s) are possible in light of the above teachings. It is therefore to be understood that within the scope of the appended claims, the invention(s) may be practiced otherwise than as specifically described herein.

What is claimed is:

1. A method for producing a patterned substrate, comprising:
   directly or indirectly coating only a periphery of a substrate with a composition to form a protective film;
   directly or indirectly forming a resist pattern on the substrate having the protective film; and
   performing etching using the resist pattern as a mask,
   wherein the composition comprises:
   at least one compound selected from the group consisting of a novolac resin, a compound having a fluorenebisphenol skeleton, a compound having a spiroindene skeleton, a compound having a truxene skeleton, and a compound having a triphenylbenzene skeleton; and a solvent, the solvent comprising a first solvent having a normal boiling point of 156° C. or higher and lower than 300° C.

2. The method for producing a patterned substrate according to claim 1, wherein a content of the first solvent in the solvent is 20 mass % or more and 100 mass % or less with respect to a total mass of the solvent.

3. The method for producing a patterned substrate according to claim 1, wherein a content of the first solvent in the solvent is 40 mass % or more and 60 mass % or less with respect to a total mass of the solvent.

4. The method for producing a patterned substrate according to claim 1, wherein the first solvent is an ester, an alcohol, an ether, a carbonate, or a combination of two or more of an ester, an alcohol, an ether, and a carbonate.

5. The method for producing a patterned substrate according to claim 1, wherein the first solvent has a normal boiling point of 205° C. or higher.

6. The method for producing a patterned substrate according to claim 1, wherein the first solvent comprises at least one selected from the group consisting of an ether and a carbonate.

7. The method for producing a patterned substrate according to claim 6, wherein the ether is a dialkylene glycol monoalkyl ether acetate.

8. The method for producing a patterned substrate according to claim 1, wherein a content of the solvent is 10 mass % or more and 90 mass % or less with respect to a total mass of the composition.

9. The method for producing a patterned substrate according to claim 1, wherein the solvent further comprises a second solvent having a normal boiling point of lower than 156° C.

10. The method for producing a patterned substrate according to claim 9, wherein the second solvent is an alkylene glycol monoalkyl ether, an alkylene glycol monoalkyl ether acetate, or a combination of an alkylene glycol monoalkyl ether and an alkylene glycol monoalkyl ether acetate.

11. The method for producing a patterned substrate according to claim 9, wherein a content of the second solvent is 10 mass % or more and 80 mass % or less with respect to a total mass of the solvent.

12. The method for producing a patterned substrate according to claim 9, wherein a content of the second solvent is 30 mass % or more and 60 mass % or less with respect to a total mass of the solvent.

13. The method for producing a patterned substrate according to claim 1, wherein an evaporation rate of the first solvent relative to butyl acetate is 0.01 or more and 10 or less, provided that an evaporation rate of butyl acetate is defined as 100.

14. The method for producing a patterned substrate according to claim 1, further comprising, before forming the resist pattern, directly or indirectly forming an organic underlayer film on the substrate having the protective film.

15. The method for producing a patterned substrate according to claim 1, further comprising, before forming the resist pattern, directly or indirectly forming a silicon-containing film on the substrate having the protective film.

16. The method for producing a patterned substrate according to claim 1, wherein the at least one compound comprises a novolac resin.

17. The method for producing a patterned substrate according to claim 16, wherein the novolac resin is a resin having structural units derived from dihydroxynaphthalene and formaldehyde.

18. The method for producing a patterned substrate according to claim 16, wherein the novolac resin is a resin having structural units derived from fluorenebisphenol and formaldehyde.

19. The method for producing a patterned substrate according to claim 16, wherein the novolac resin is a resin having structural units derived from fluorenebisnaphthol and formaldehyde.

20. The method for producing a patterned substrate according to claim 16, wherein the novolac resin is a resin having structural units derived from hydroxypyrene and formaldehyde.

21. The method for producing a patterned substrate according to claim 16, wherein the novolac resin is a resin having structural units derived from a phenolic compound and formylpyrene.

22. The method for producing a patterned substrate according to claim 16, wherein the novolac resin has a propargyl group.

23. A method for producing a patterned substrate, comprising:

directly or indirectly coating only a periphery of a substrate with a composition to form a protective film;

directly or indirectly forming a resist pattern on the substrate having the protective film; and performing etching using the resist pattern as a mask, wherein the composition comprises:

at least one compound selected from the group consisting of a novolac resin, a compound having a fluorenebisphenol skeleton, a compound having a spiroindene skeleton, a compound having a truxene skeleton, and a compound having a triphenylbenzene skeleton; and a solvent, the solvent comprising: a first solvent which has a normal boiling point of 205° C. or higher and is at least one solvent selected from the group consisting of a dialkylene glycol monoalkyl ether acetate and a carbonate; and a second solvent which has a normal boiling point of lower than 156° C. and is at least one solvent selected from the group consisting of an alkylene glycol monoalkyl ether and an alkylene glycol monoalkyl ether acetate, a content of the first solvent in the solvent being 40 mass % or more and 60 mass % or less with respect to a total mass of the solvent, and a content of the second solvent is 30 mass % or more and 60 mass % or less with respect to a total mass of the solvent.

24. The method for producing a patterned substrate according to claim 23, wherein the at least one compound comprises a novolac resin.

* * * * *